(12) United States Patent
Hutton et al.

(10) Patent No.: US 7,420,390 B1
(45) Date of Patent: Sep. 2, 2008

(54) METHOD AND APPARATUS FOR IMPLEMENTING ADDITIONAL REGISTERS IN FIELD PROGRAMMABLE GATE ARRAYS TO REDUCE DESIGN SIZE

(75) Inventors: Michael D. Hutton, Mountain View, CA (US); James G. Schleicher, II, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 19 days.

(21) Appl. No.: 11/328,407

(22) Filed: Jan. 9, 2006

(51) Int. Cl.
*H03K 19/177* (2006.01)
(52) U.S. Cl. .............................. 326/40; 326/39; 326/38
(58) Field of Classification Search .................. 326/39, 326/40
See application file for complete search history.

(56) References Cited

U.S. PATENT DOCUMENTS

| | | | |
|---|---|---|---|
| 6,011,730 A * | 1/2000 | Sample et al. ......... | 365/189.05 |
| 6,026,481 A * | 2/2000 | New et al. ...................... | 712/43 |
| 6,212,670 B1 * | 4/2001 | Kaviani ....................... | 716/17 |
| 6,249,143 B1 * | 6/2001 | Zaveri et al. .................. | 326/40 |
| 6,373,279 B1 * | 4/2002 | Bauer et al. ................... | 326/40 |
| 6,924,663 B2 * | 8/2005 | Masui et al. .................. | 326/38 |
| 2004/0155677 A1 * | 8/2004 | Lewis et al. ................... | 326/40 |
| 2006/0230376 A1 * | 10/2006 | Yuan et al. .................... | 716/17 |

* cited by examiner

*Primary Examiner*—Vibol Tan
(74) *Attorney, Agent, or Firm*—L. Cho

(57) ABSTRACT

A field programmable gate array includes a plurality of programmable logic blocks to implement one or more logic functions. The field programmable gate array includes a plurality of independent registers not associated with any specific one of the plurality of programmable logic blocks. The plurality of independent registers may be programmed to support any one of the plurality of programmable logic blocks.

37 Claims, 10 Drawing Sheets

US 7,420,390 B1

METHOD AND APPARATUS FOR IMPLEMENTING ADDITIONAL REGISTERS IN FIELD PROGRAMMABLE GATE ARRAYS TO REDUCE DESIGN SIZE

TECHNICAL FIELD

The present invention relates to the field of field programmable gate arrays (FPGAs). More specifically, the present invention relates to a method and apparatus for implementing additional registers in FPGAs to reduce the design size of systems.

BACKGROUND

FPGAs are integrated circuits that include logic, processing, memory, and routing resources that may be programmed in the field after manufacture. FPGAs may be used to implement large systems that include millions of gates and megabits of embedded memory. As FPGAs have improved in performance, it has become more common to time-division-multiplex slower or more expensive blocks on the FPGA, such as digital signal processing (DSP) blocks. This has created the need for pipelining on logic paths where successive registers are placed in series without implementing logic components between the registers.

Most FPGAs include logic blocks that have combinational cells and registers that are programmable to implement logic functions. Each logic block may include one or more combinational cells and registers, where the number of combinational cells is typically equal to the number of registers. When pipelining requires data from a first logic path to be synchronized with data from a second logic path or requires data to be registered into numerous stages, additional logic blocks are commonly used to provide the needed registers.

This approach, however, resulted in the use of only the register portion of a logic block and wasting the combinational cell portion of the logic block which was often the larger and more expensive of the components. More unused space would be needed to implement these systems which is inefficient and costly.

Thus, what is needed is an efficient and effective method and apparatus for supporting system designs requiring additional registers on an FPGA.

SUMMARY

According to an embodiment of the present invention, additional registers are made available on an FPGA such that the ratio of registers to combinational cells, where each combinational cell includes a single output, is greater than 1:1. The registers may be independent registers that are not associated with any one of the logic modules. Alternatively, the registers may be implemented and linked to a logic module. The additional registers allow systems to be fitted onto a smaller FPGA.

BRIEF DESCRIPTION OF THE DRAWINGS

The features and advantages of the embodiments of the present invention are illustrated by way of example and are by no means intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
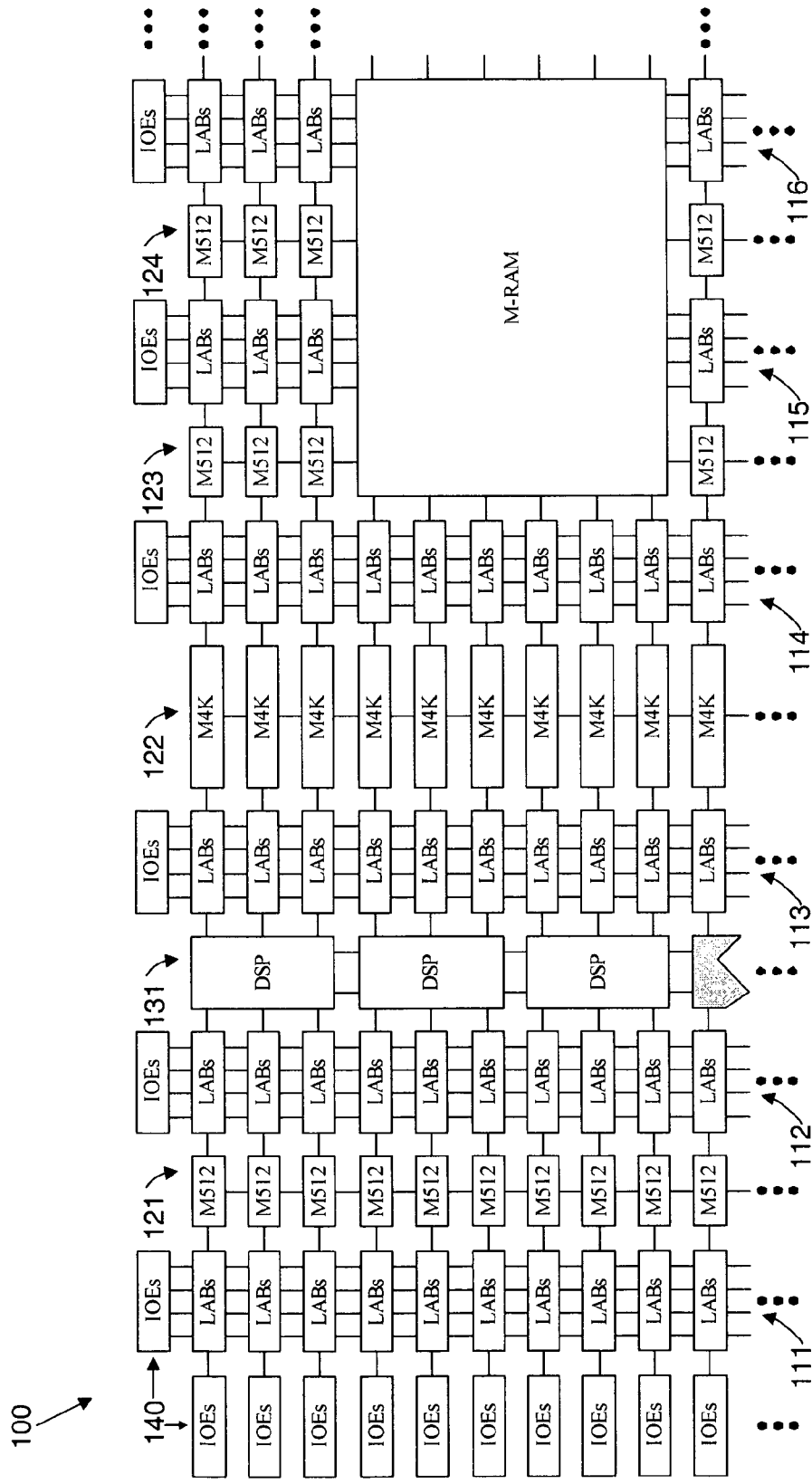
FIG. 1 illustrates a target device utilizing FPGAs according to an embodiment of the present invention.

FIG. 1 illustrates an exemplary target device 100 in which a system may be implemented on 100 utilizing an FPGA according to an embodiment of the present invention. According to one embodiment, the target device 100 is a chip having a hierarchical structure that may take advantage of wiring locality properties of circuits formed therein.

The target device 100 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. LUT chain connections transfer the output of one logic block LUT to the adjacent logic block for fast sequential LUT connections within the same LAB. Register chain connection lines transfer the output of one logic block register to the adjacent logic block's register within a LAB. According to an alternate embodiment of the present invention, the logic block may operate similarly to an adaptive logic module (ALM), such as those found in Stratix™ manufactured by Altera® Corporation. In this embodiment, the logic block may include 2 registers, 2 sets of addition circuitry, a combinational logic module that may be configured to implement two single six input LUT, or two LUTs with five or fewer inputs. LABs are grouped into rows and columns across the target device 100. Columns of LABs are shown as 111-116. It should be appreciated that the logic block may include additional or alternate components.

According to an embodiment of the present invention, additional registers are available for implementing logic functions with the logic blocks in the target device. The additional registers may be associated with a LAB or a subset of logic blocks within a LAB. The registers may be independent registers that are not associated with a specific logic block. Alternatively, the registers may be integrated inside logic blocks.

The target device 100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 100. Columns of memory blocks are shown as 121-124.

The target device 100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 100 and are shown as 131.

The target device 100 includes a plurality of input/output elements (IOEs) 140. Each IOE feeds an I/O pin (not shown) on the target device 100. The IOEs are located at the end of LAB rows and columns around the periphery of the target device 100. Each IOE includes a bidirectional I/O buffer and a plurality of registers for registering input, output, and output-enable signals. When used with dedicated clocks, the registers provide performance and interface support with external memory devices.

The target device 100 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The target device 100 also includes a plurality of row interconnect lines ("H-type wires") (not shown) that span fixed distances. Dedicated row interconnect lines, route signals to and from LABs, DSP blocks, and memory blocks within the same row. The row interconnect lines may span a distance of up to four, eight, and twenty-four LABs respectively, and are used for fast row connections in a four-LAB, eight-LAB, and twenty-four-LAB region. The row interconnects may drive and be driven by LABs, DSP blocks, RAM blocks, and horizontal IOEs.

The target device 100 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. The column interconnect lines may traverse a distance of four, eight, and sixteen blocks respectively, in a vertical direction.

FIG. 1 illustrates an exemplary embodiment of a target device. It should be appreciated that a system may include a plurality of target devices, such as that illustrated in FIG. 1, cascaded together. It should also be appreciated that the target device may include programmable logic devices arranged in a manner different than that on the target device 100. A target device may also include FPGA resources other than those described in reference to the target device 100. Thus, while the invention described herein may be utilized on the architecture described in FIG. 1, it should be appreciated that it may also be utilized on different architectures, such as those employed by Altera® Corporation in its APEX™, Stratix™, Cyclone™, Stratix™ II, and Cyclone™ II families of chips and those employed by Xilinx® Inc. in its Virtex™ and Virtex™ II, and Virtex IV™ line of chips.

Figure 2:
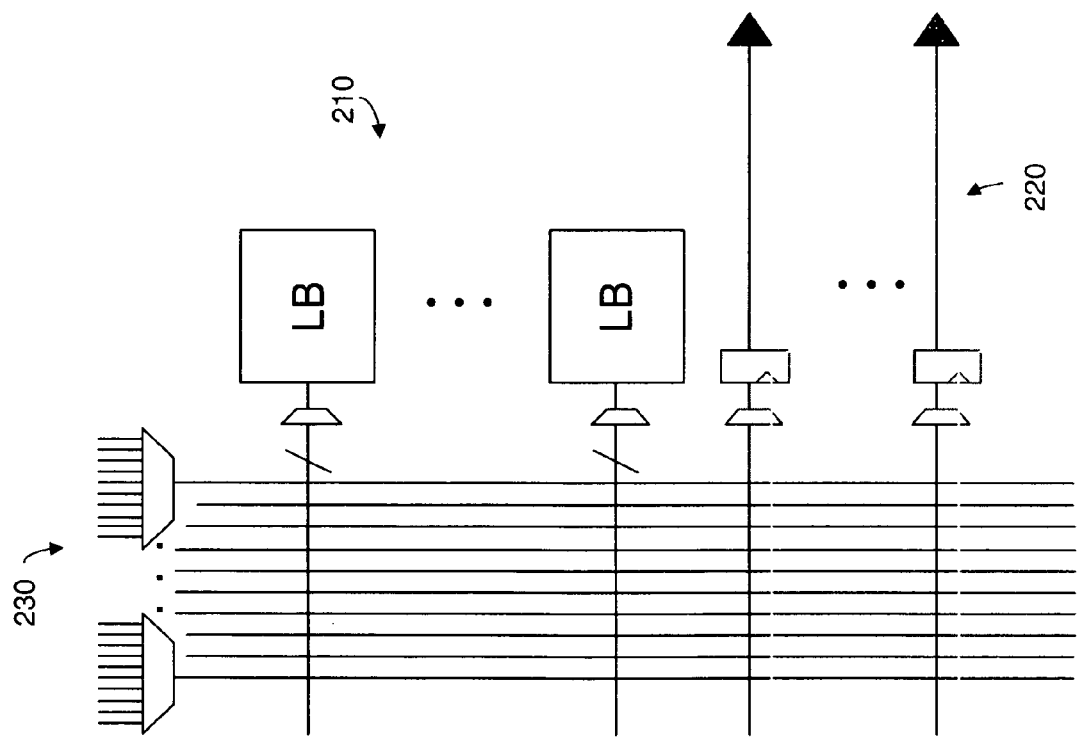
FIG. 2 illustrates a plurality of logic blocks with a plurality of independent registers according to a first embodiment of the present invention.

FIG. 2 illustrates a LAB 200 having a plurality of logic blocks (LBs) 210 and a plurality of independent registers 220 according to a first embodiment of the present invention. The LAB 200 includes a routing fabric 230 that is programmable to route signals to the logic blocks 210 and independent registers 220. The logic blocks 210 may operate similarly to LEs, CLBs, ALMs, or other components. The independent registers 220 may be grouped together as shown in FIG. 2. Each of the independent registers 220 may be implemented together with any of the logic blocks 210 in the LAB. According to an embodiment of the LAB 200, each of the independent registers 220 may have an associated multiplexer to select from an input to any of the logic blocks 210 or output from any of the logic blocks 210.

Figure 3:
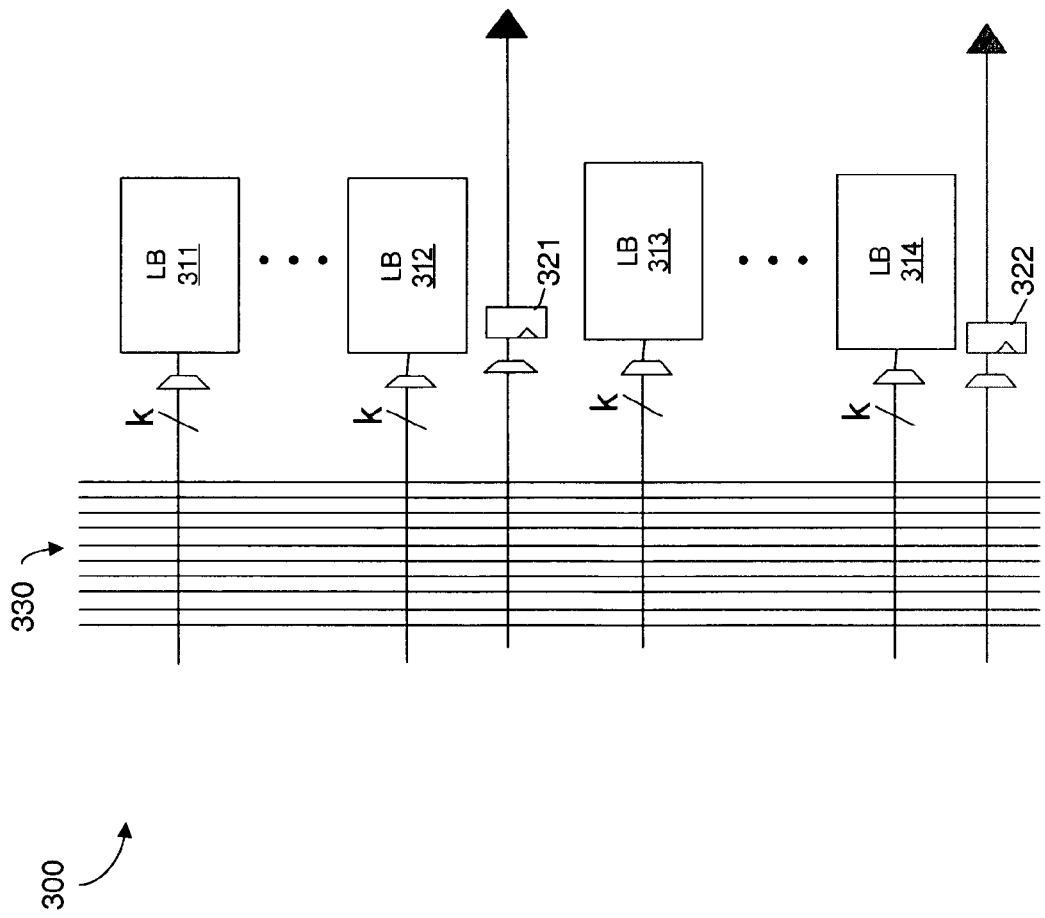
FIG. 3 illustrates a plurality of logic blocks with a plurality of independent registers according to a second embodiment of the present invention.

FIG. 3 illustrates a LAB 300 having a plurality of logic blocks 311-314 and a plurality of independent registers 321-322 according to a second embodiment of the present invention. The LAB 300 includes a routing fabric 330 that is programmable to route signals to the logic blocks 311-314 and independent registers 321-322. The logic blocks 311-314 may operate similarly to LEs, CLBs, ALMs, or other components. The independent registers may be placed within a proximity to subsets of logic blocks in the LAB 300 that the independent registers may be implemented as shown. For example, independent registers 321 may be implemented together with any of the logic blocks 311-312, and independent register 322 may be implemented together with any of the logic blocks 313-314. According to an embodiment of the LAB 300, each of the independent registers 321-322 may have an associated multiplexer to select from an input to logic blocks 311-312, and 313-314 or output from any of the logic blocks 311-312, and 313-314, respectively.

FIGS. 2 and 3 illustrate exemplary configurations of how independent registers may be positioned with logic blocks. It should be appreciated that the independent registers shown may be positioned differently. For example, an independent register may be positioned between every logic block, every two logic blocks, or between various numbers of logic block groupings.

Figure 4:
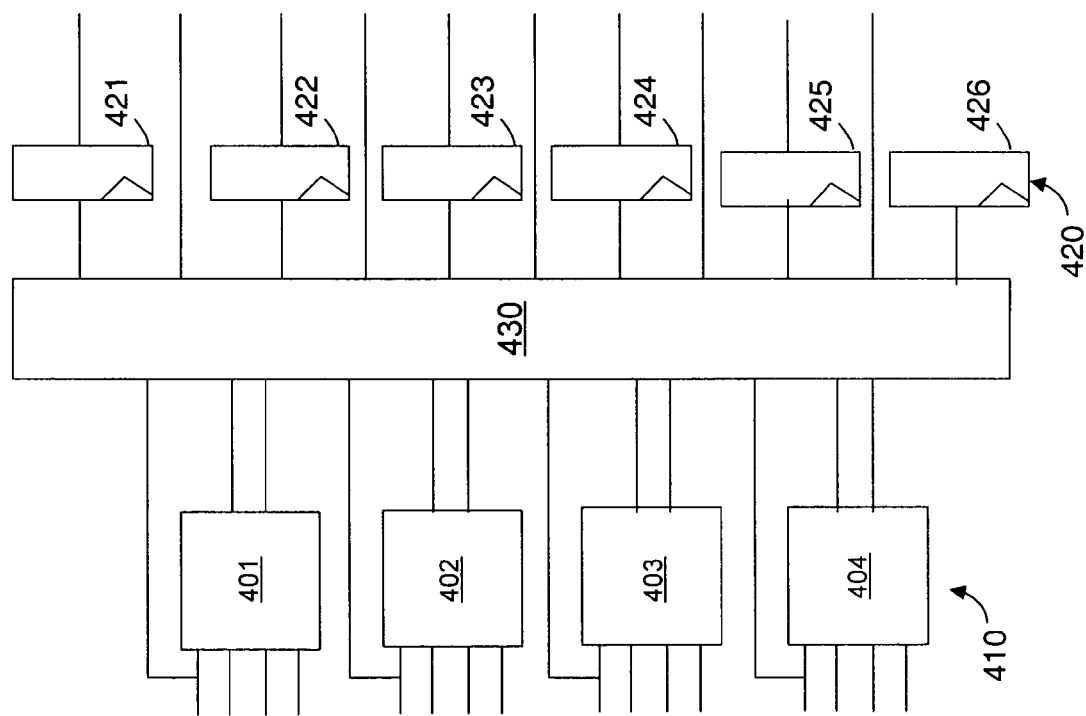
FIG. 4 illustrates a plurality of combinational cells with a plurality of independent registers according to an embodiment of the present invention.

FIG. 4 illustrates a plurality of combinational cells 410 with a plurality of independent registers 420 according to an embodiment of the present invention. According to one embodiment, the plurality of combinational cells 410 may be LUTs from one or more logic blocks from one or more LABs. Each of the independent registers 421-426 may be implemented with any one of the combinational cells 401-404. A routing network 430 is used to connect an input line or output line from any of the combinational cells 401-404 to any one of the independent registers 421-426. The routing network 430 may be a programmable routing network. According to an embodiment of the present invention, the routing network 430 may be implemented with one or more multiplexers.

FIG. 5 illustrates a first logic block 510 with an independent register 540 according to a first embodiment of the present invention. The first logic block 510 includes a combinational cell 520. According to an embodiment of the first logic block 510, the combinational cell 520 may be implemented by a four input lookup table. The first logic block 510 includes a register 530. According to an embodiment of the first logic block 510, the register 530 may be implemented by a flip-flop. The first logic block 510 may be configured to be a four input look up table with combinational output, a four input look up table with registered output, or a four input look up table with both combinational and registered output. A combinational three input look up table packed with an unused register may also be implemented.

Independent register 540 may be programmably driven by an additional input 541 or by sharing (stealing) an input of the combinational cell 520. In an alternate embodiment of the present invention, the independent register 540 is driven only either by the input 541 or by a register cascade from register 530.

Figure 5A:
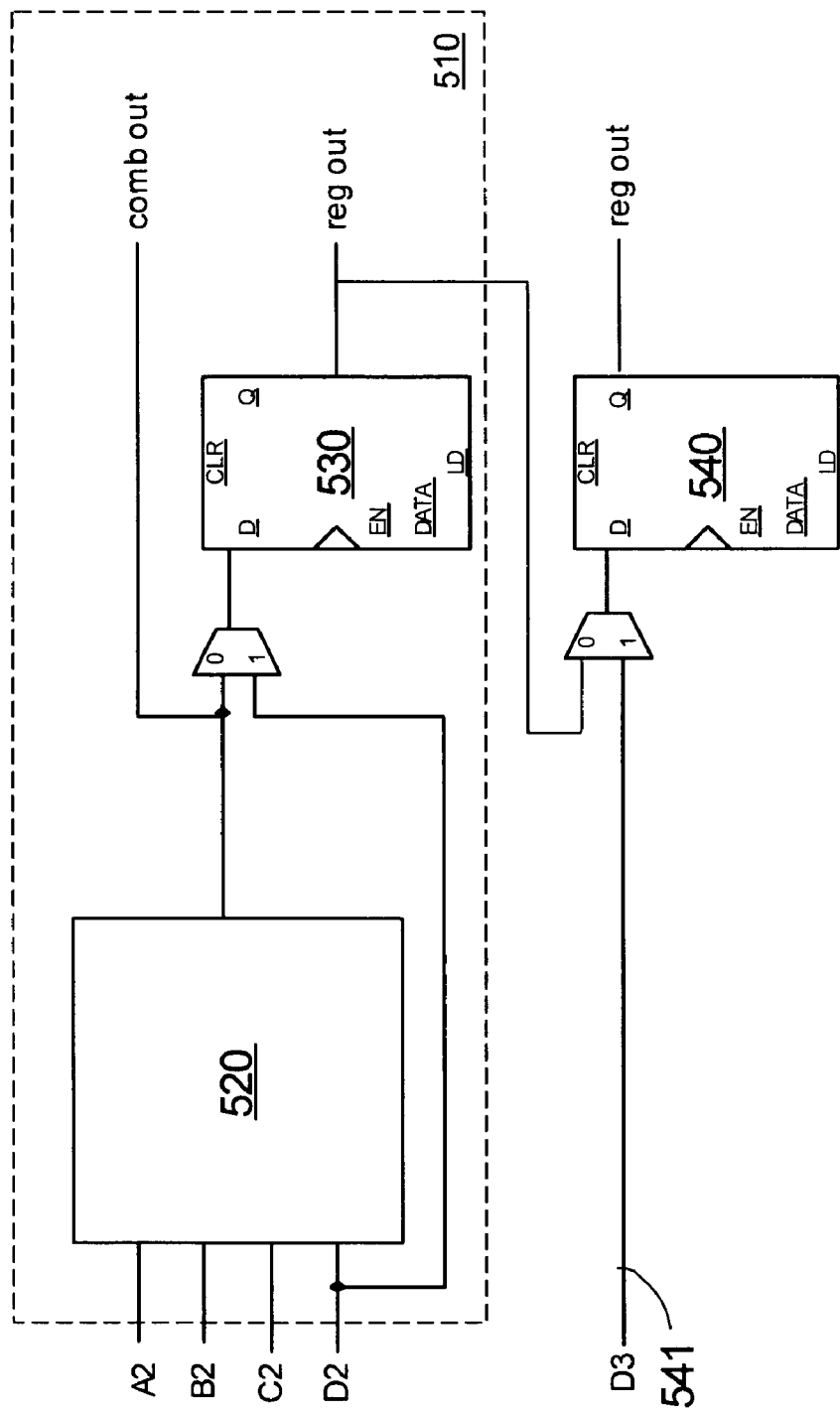
FIG. 5a illustrates a first logic block with an independent register according to a first embodiment of the present invention.
Figure 5B:
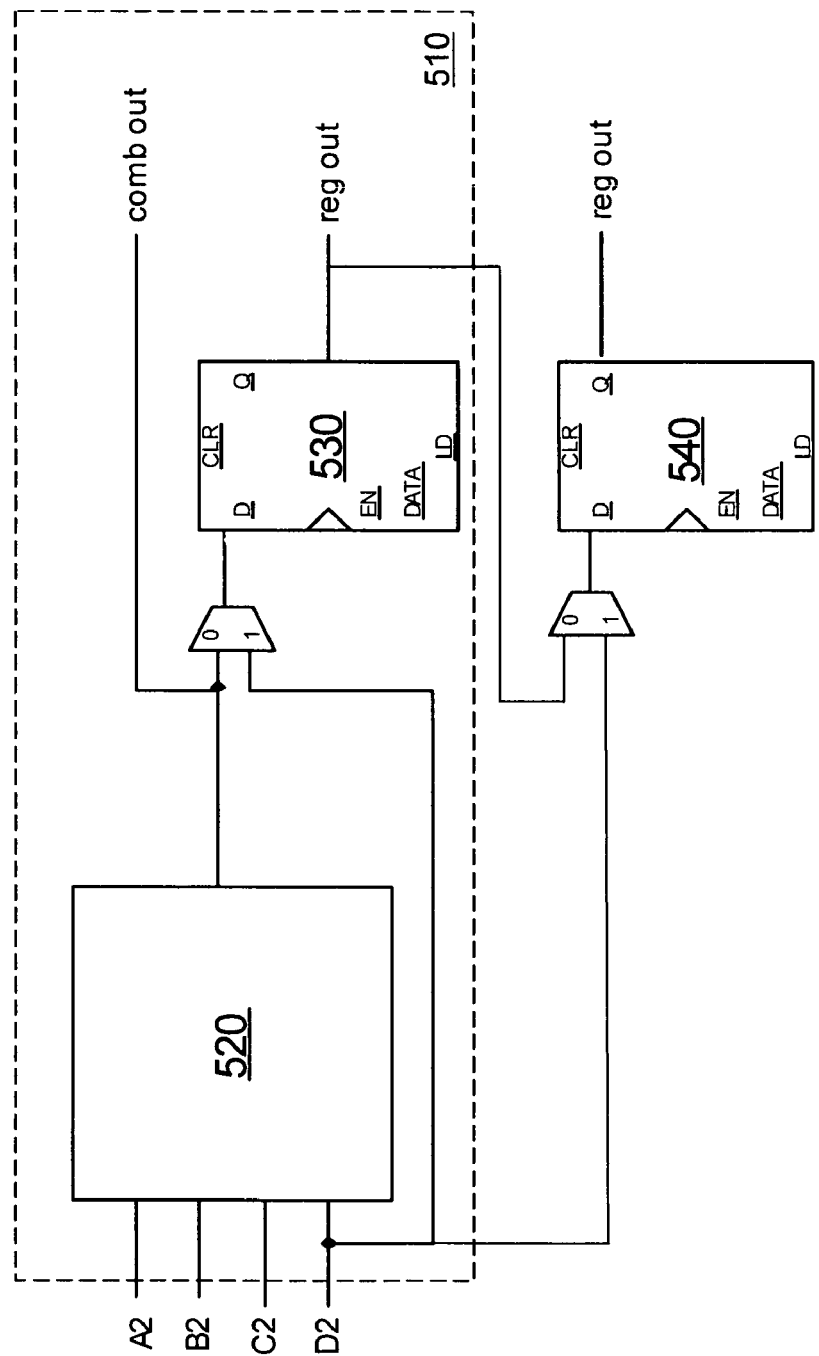
FIG. 5b illustrates a first logic block with an independent register according to a second embodiment of the present invention.

FIG. 5b illustrates a first logic block 510 with an independent register 540 according to a first embodiment of the present invention. In this embodiment, independent register 540 may be programmably driven by sharing an input of the combinational cell 520 or by a register cascade from register 530, without requiring an additional input.

Figure 6:
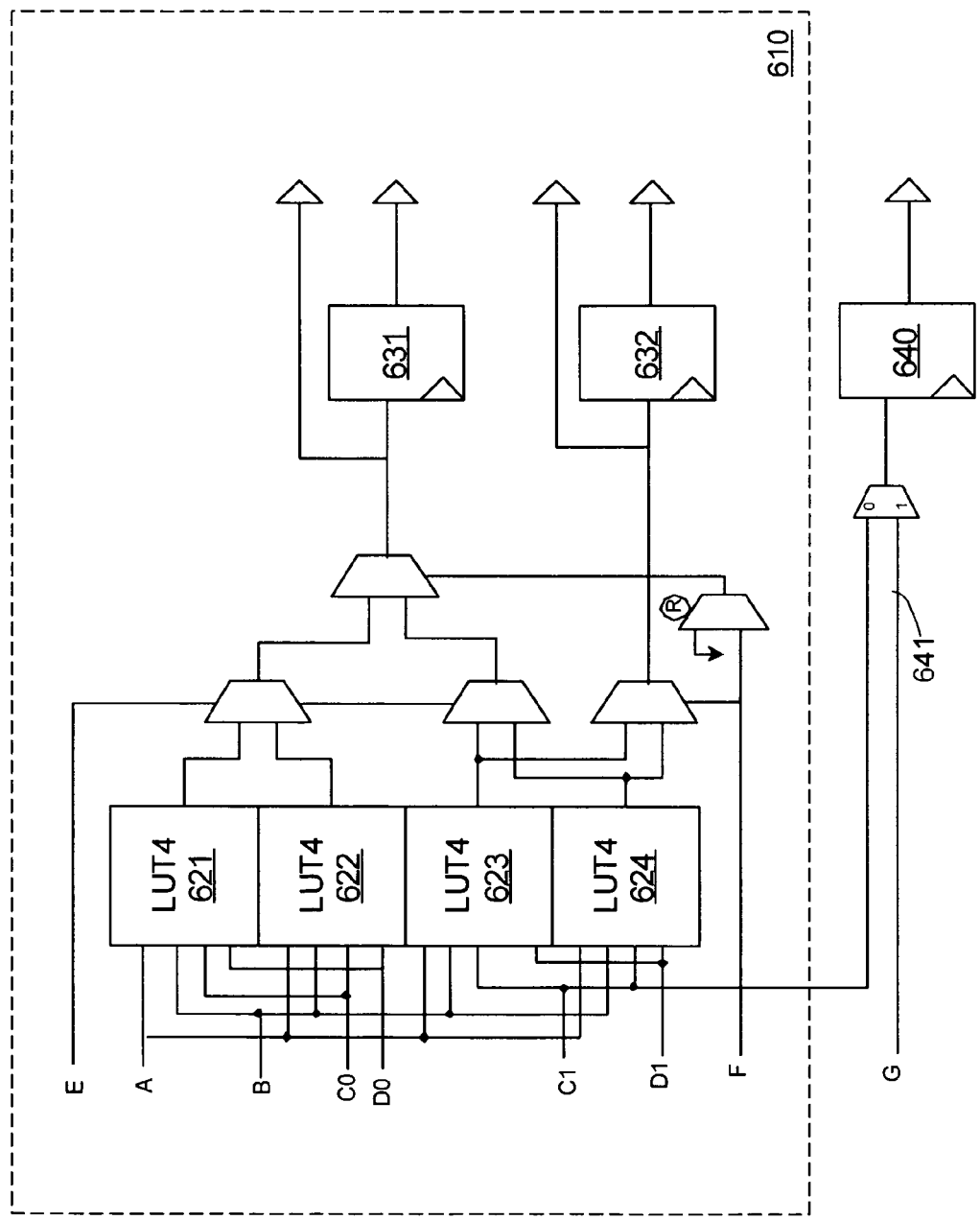
FIG. 6 illustrates a second logic block with an independent register according to an embodiment of the present invention.

FIG. 6 illustrates a second logic block 610 with an independent register 640 according to an embodiment of the present invention. The second logic block 610 includes a plurality of combinational cells 621-624. According to an embodiment of the second logic block 610, the combinational cells 621-624 may each be implemented by a four input lookup table. The second logic block 610 includes a plurality of registers 631-632. According to an embodiment of the second logic block 610, the registers 631-632 may each be implemented by a flip-flop. The second logic block 610 may be configured, for example, to be a six input lookup table with two packed registers, two four input lookup tables driving two registers, or two four input look up tables sharing inputs with packed registers. Packing of registers allows logic blocks which have a register:lookup table ratio below 1 to match unused registers with unused combinational cells to achieve a number of packed logic blocks equal to the maximum of the two values.

Independent register 640 may be driven by an additional input 641 or by sharing (stealing) an input to one of the combinational cells 621-624. In an alternate embodiment of the present invention, the independent register 640 is driven only either by the input 641 or an input to one of the combinational cells 621-624. The multiplexer driven by C1 and G allows independent register 640 to select from two alternative input sources for additional routing flexibility. It should be appreciated that the multiplexer driven by C1 and G need not be implemented. In this embodiment, the independent register 640 may be driven directly by G, or the 0 input of the independent register 640 may be driven by register 632 as illustrated in FIGS. 5a and 5b.

Figure 7:
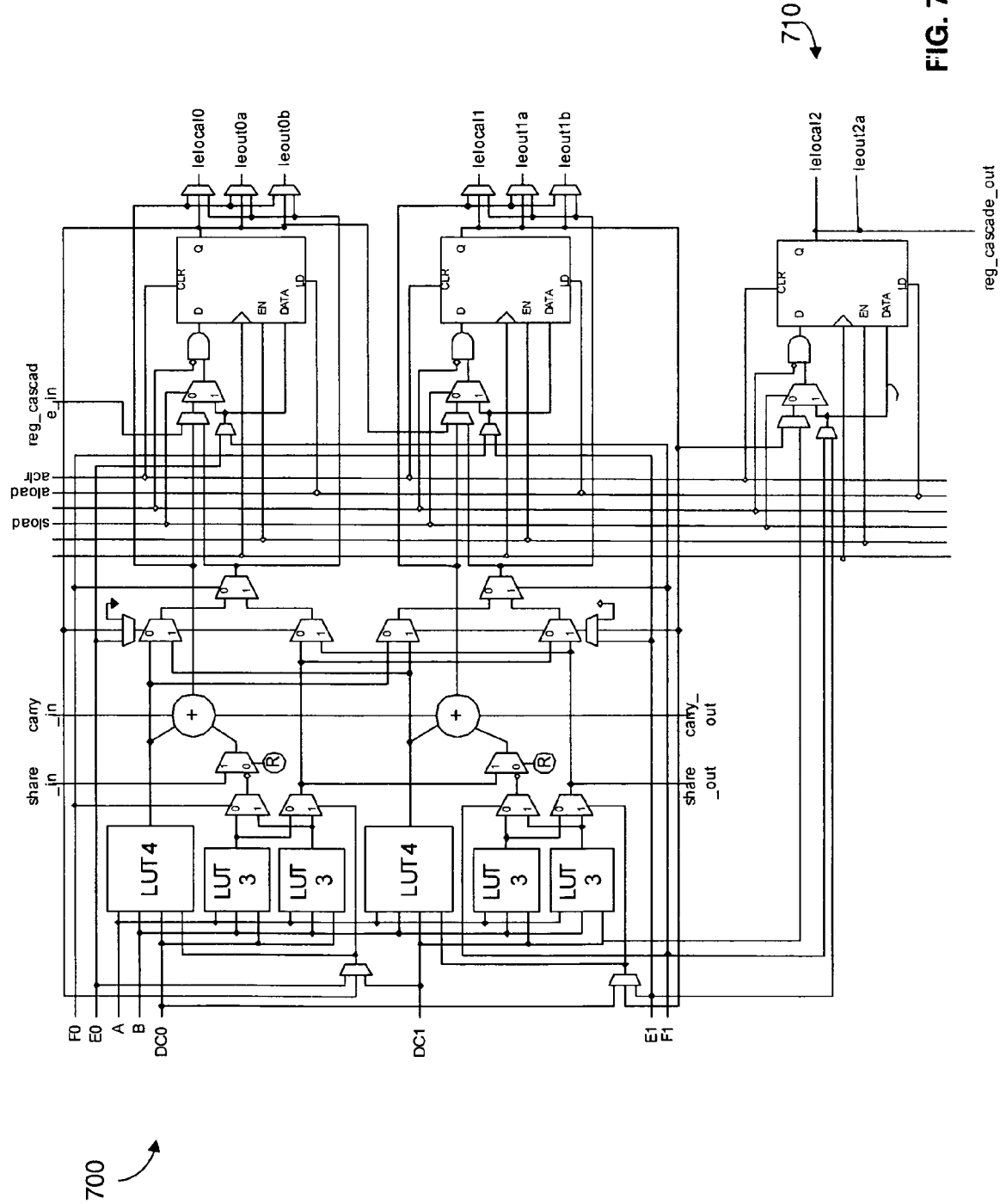
FIG. 7 illustrates the second logic block with the independent register according to a second embodiment of the present invention.

FIG. 7 illustrates a detailed block diagram of the second logic block 610 with the independent register 640 (shown in FIG. 6) according to a second embodiment of the present invention. According to one embodiment, a cluster-wide SLOAD signal may be used to steer an input of the logic block into a load circuitry of the register. Input select signals are driven by taps off of input E1 and F1. Since there is no LUT associated with register 710, a tap of DC1 or a register cascade may be made. Through programming bits, the signals from inputs E1 and F1 may be steered to the ACLR input of register 710. When a global ALOAD signal is disabling, the input to register 810 can additionally be selected as E1 or F1. It should be appreciated that the selection of signals to drive E1, F1, and DC1 may be effectuated by other logical signals in the second logic block 800 or from signals from other logic blocks. The register 710 may also be physically situated in between registers in the second logic block 800, in which a different register cascade path could be implemented.

Adders in FPGAs are commonly used building blocks. In some FPGAs, a four input LUT may be split into a sum and carry three input LUT and the output. When a very long cary chain is present in a design, it may be desirable to pipeline the output of the carry.

Figure 8:
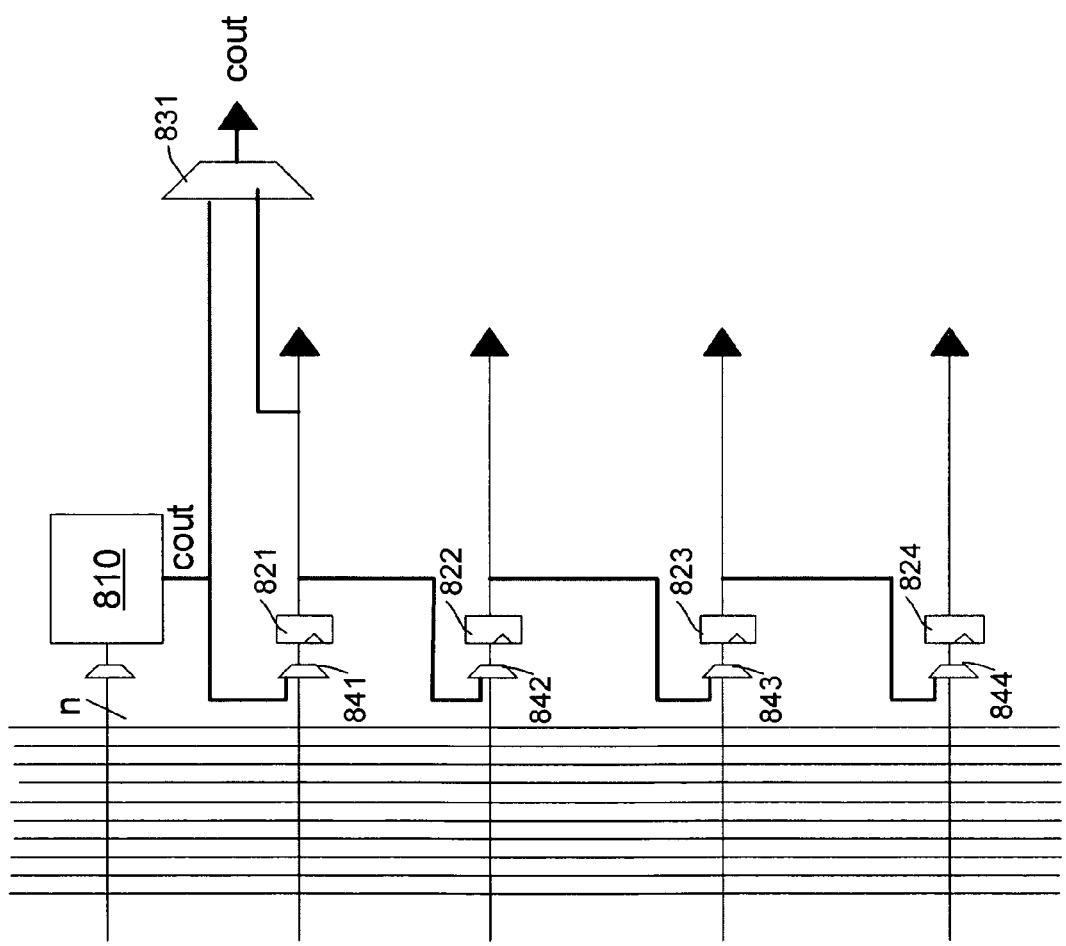
FIG. 8 illustrates how a logic block with a plurality of independent registers may be programmed to perform a pipelined carry according to an embodiment of the present invention.

FIG. 8 illustrates how a logic block 810 with a plurality of independent registers 821-824 may be programmed to perform a pipelined carry according to an embodiment of the present invention. In this embodiment, the carry out is optionally selected as input to independent register 821. A multiplexer 831 may be added to select between the original carry out and the delayed-by-one-clock carry out. In this manner, pipelining can be created with a minimal electrical delay on the original carry chain, and minimal area penalty is incurred by routing to an available independent registered. As shown, multiplexers 842-824 are implemented to select between register-cascades and dedicated inputs. In an alternate embodiment, multiplexers 842-824 may be implemented to select between register-cascades, a carry-out from previous logic block, or dedicated inputs.

Figure 9:
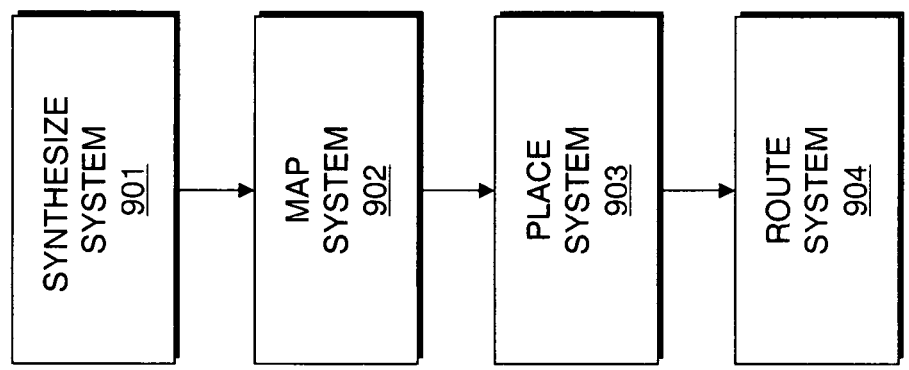
FIG. 9 is a flow chart illustrating a method for designing a system according to an embodiment of the present invention.

FIG. 9 is a flow chart that illustrates a method for designing a system according to an embodiment of the present invention. The method may be performed with the assistance of an EDA tool, for example. At 901, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

At 902, the optimized logical design of the signal is mapped. Mapping includes determining how to implement components such as logic gates and other components in the optimized logic representation with resources available on a target device. According to an embodiment of the present invention, a netlist is generated from mapping. The netlist illustrates how the resources of the target device are utilized to implement the system. The netlist may, for example, include a representation of the components on the target device and how the components are connected. Mapping may include, for example, determining how components may be implemented using logic modules. The components may include, for example, digital logic such as logic gates, memory devices, and/or other components. Mapping may also include, for example, determining which logic modules should be packed together in a LAB. Although the resources on a target device are assigned for implementing the components, the specific resources and their locations are not assigned in 902.

At 903, the mapped logical system design is placed. Placement includes fitting the system on the target device by determining which resources (and their location) on the target device is to be used for specific components and connections between the components. According to an embodiment of the present invention, determining which resources on the target device to by used for specific components includes assigning an independent register not associated with any specific logic block to a logic block. The register may be used to support programmable combinational and register cells in the logic block. Assigning an independent register may include programming the independent register to receive a shared input from the programmable combinational and register cell. Alternatively, assigning the independent register may include programming the independent register to receive an output from the programmable combinational and register cell. The placement procedure may be performed by a placer in an EDA tool that utilizes placement algorithms. According to an embodiment of the present invention, a user (designer) may provide input to the placer by specifying placement constraints.

At 904, routing of the system is performed. During routing, routing resources on the target device are allocated to provide interconnections between resources such as logic blocks, memories, DSP blocks, and other components on the target device.

FIG. 9 is a flow chart illustrating a method for designing a system according to an embodiment of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention may be provided as a computer program product or software that may include an article of manufacture on a machine accessible or a machine readable medium having instructions. The instructions on the machine accessible medium may be used to program a computer system or other electronic device. The machine accessible medium may include, but is not limited to, floppy diskettes, optical disks, CD-ROMs, magneto-optical disks, or other types of media/machine accessible medium suitable for storing or transmitting electronic instructions. The technique described herein are not limited to any particular software configuration. They may find applicability in any computing or processing environment. The term "machine accessible medium" used herein shall include any medium that is capable of storing, encoding, or transmitting a sequence of instructions for execution by the machine and that causes the machine to perform any one of the methods described herein. Furthermore, it is common in the art to speak of software, in one form or another (e.g. program, procedure, process, application, module, unit, logic, and so on) as taking an action or causing a result. Such expressions are merely a shorthand way of stating that the execution of the software by a processing system causes the processor to perform an action to produce a result.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A field programmable gate array (FPGA), comprising:
   a plurality of programmable logic blocks to implement one or more logic functions; and
   a plurality of independent registers programmable to support any one of the plurality of programmable logic blocks to provide synchronization for pipelining signals on the FPGA, wherein each of the plurality of independent registers includes an input line independent of any programmable logic block.

2. The FPGA of claim 1, wherein the plurality of programmable logic blocks make up a logic array block.

3. The FPGA of claim 1, wherein the plurality of programmable logic blocks make up a subset of a logic array block.

4. The FPGA of claim 1, wherein the plurality of programmable logic blocks comprises combinational cells and registers.

5. The FPGA of claim 1, wherein each of the plurality of independent registers is programmable to receive a shared input from one of the plurality of programmable logic blocks.

6. The FPGA of claim 1, wherein each of the plurality of independent registers is programmable to receive an output from one of the plurality of programmable logic blocks.

7. The FPGA of claim 1, wherein the plurality of independent registers is programmable to implement a pipelined carry when the plurality of programmable logic blocks are programmed to implement an adder circuit.

8. The FPGA of claim 1, further comprising a switching network that includes one or more multiplexers to program the first plurality of independent registers.

9. The FPGA of claim 1, wherein a programmable logic block comprises a four input look up table (LUT) and a flip-flop.

10. The FPGA of claim 1, wherein the input line is a direct cascade connection from a register.

11. The FPGA of claim 1, wherein the programmable logic block is fracturable into a plurality of configurations.

12. The FPGA of claim 1, wherein the plurality of programmable logic blocks make up a logic array block.

13. The FPGA of claim 1, wherein the plurality of programmable logic blocks make up a subset of a logic array block.

14. The FPGA of claim 1, wherein the plurality of programmable logic blocks comprises combinational cells and registers.

15. The FPGA of claim 1, wherein the programmable logic block is fracturable into a plurality of configurations.

16. A field programmable gate array (FPGA), comprising:
    a plurality of programmable logic blocks to implement one or more logic functions; and
    a plurality of independent registers unassigned to any specific one of the plurality of programmable logic blocks and programmable to support any one of the plurality of programmable logic blocks, wherein each of the plurality of independent registers is programmable to receive one of a shared input and a shared output from one of the plurality of programmable logic blocks.

17. The FPGA of claim 16, wherein the plurality of independent registers are programmable to implement a pipelined carry when the plurality of programmable logic blocks are programmed to implement an adder circuit.

18. The FPGA of claim 16, wherein the plurality of programmable logic blocks make up a logic array block.

19. The FPGA of claim 16, wherein the plurality of programmable logic blocks make up a subset of a logic array block.

20. The FPGA of claim 16, wherein the plurality of programmable logic blocks comprises combinational cells and registers.

21. The FPGA of claim 16, wherein each of the plurality of independent registers includes an input line independent of any programmable logic block.

22. The FPGA of claim 21, wherein the input line is a direct cascade connection from a register.

23. The FPGA of claim 16, further comprising a switching network that includes one or more multiplexers to program the first plurality of independent registers.

24. The FPGA of claim 16, wherein a programmable logic block comprises a four input look up table (LUT) and a flip-flop.

25. The FPGA of claim 16, wherein the programmable logic block is fracturable into a plurality of configurations.

26. A field programmable gate array (FPGA), comprising:
a plurality of programmable logic blocks to implement one or more logic functions; and
a plurality of independent registers programmable to support any one of the plurality of programmable logic blocks, wherein each of the plurality of independent registers includes an input line that is programmable to receive one of a first input independent of any programmable logic block, and a second input from a direct cascade connection from a register.

27. A field programmable gate array (FPGA), comprising:
a plurality of programmable logic blocks to implement one or more logic functions; and
a plurality of independent registers programmable to support any one of the plurality of programmable logic blocks to provide synchronization for pipelining signals on the FPGA, wherein the plurality of independent registers is programmable to implement a pipelined carry when the plurality of programmable logic blocks are programmed to implement an adder circuit.

28. The FPGA of claim 27, wherein the plurality of programmable logic blocks make up a logic array block.

29. The FPGA of claim 27, wherein the plurality of programmable logic blocks make up a subset of a logic array block.

30. The FPGA of claim 28, wherein the plurality of programmable logic blocks comprises combinational cells and registers.

31. The FPGA of claim 28, wherein each of the plurality of independent registers includes an input line independent of any programmable logic block.

32. The FPGA of claim 29, wherein each of the plurality of independent registers is programmable to receive a shared input from one of the plurality of programmable logic blocks.

33. The FPGA of claim 30, wherein each of the plurality of independent registers is programmable to receive an output from one of the plurality of programmable logic blocks.

34. The FPGA of claim 30, wherein the plurality of independent registers is programmable to implement a pipelined carry when the plurality of programmable logic blocks are programmed to implement an adder circuit.

35. The FPGA of claim 31, further comprising a switching network that includes one or more multiplexers to program the first plurality of independent registers.

36. The FPGA of claim 31, wherein a programmable logic block comprises a four input look up table (LUT) and a flip-flop.

37. The FPGA of claim 32, wherein the input line is a direct cascade connection from a register.

* * * * *